(12) United States Patent
Shin et al.

(10) Patent No.: US 8,765,858 B2
(45) Date of Patent: Jul. 1, 2014

(54) POLYPHENYLENE SULFIDE RESIN COMPOSITION WITH IMPROVED THERMAL CONDUCTIVITY AND SURFACE APPEARANCE AND ARTICLES THEREOF

(71) Applicant: Cheil Industries Inc., Gumi-si (KR)

(72) Inventors: Chan Gyun Shin, Seoul-si (KR); Jong Cheol Lim, Anyang-si (KR); Jeong Won Lee, Yangsan-si (KR); Nam Hyun Kim, Seoul-si (KR)

(73) Assignee: Cheil Industries Inc., Gumi-si, (KR)

( * ) Notice: Subject to any disclaimer, the term of this patent is extended or adjusted under 35 U.S.C. 154(b) by 0 days.

(21) Appl. No.: 13/723,363

(22) Filed: Dec. 21, 2012

(65) Prior Publication Data
US 2013/0172466 A1    Jul. 4, 2013

(30) Foreign Application Priority Data

Dec. 30, 2011 (KR) .......................... 10-2011-0146941

(51) Int. Cl.
*C08K 3/28* (2006.01)

(52) U.S. Cl.
USPC ........... 524/428; 524/404; 524/430; 524/433; 524/437

(58) Field of Classification Search
USPC .......................... 524/404, 428, 430, 433, 437
See application file for complete search history.

(56) References Cited

U.S. PATENT DOCUMENTS

2007/0021549 A1 *   1/2007   Kojima et al. ................ 524/540

FOREIGN PATENT DOCUMENTS

JP         1977-12240 A        8/1978

* cited by examiner

*Primary Examiner* — Peter Szekely
(74) *Attorney, Agent, or Firm* — Additon, Higgins, Pendleton & Ashe, P.A.

(57) ABSTRACT

A polyphenylene sulfide resin composition comprises (A) about 30 to about 50% by weight of a polyphenylene sulfide resin; (B) about 1 to about 5% by weight of an amorphous polyamide resin; and (C) about 45 to about 69% by weight thermally conductive insulating fillers.

10 Claims, No Drawings

POLYPHENYLENE SULFIDE RESIN COMPOSITION WITH IMPROVED THERMAL CONDUCTIVITY AND SURFACE APPEARANCE AND ARTICLES THEREOF

CROSS-REFERENCE TO RELATED APPLICATIONS

This application claims priority under 35 USC Section 119 to and the benefit of Korea Patent Application No. 10-2011-0146941 filed Dec. 30, 2011, in the Korean Intellectual Property Office, the disclosure of which is incorporated herein by reference in its entirety.

FIELD OF THE INVENTION

This invention relates to a polyphenylene sulfide resin composition and articles made using the same.

BACKGROUND OF THE INVENTION

Typically, chassis and heat sinks of electronic devices have heat generating parts that are produced from metals. Metals are used for such parts because of their thermally conductive nature. Metals dissipate received heat to the surrounding area very rapidly as compared to other materials. Therefore, metals can maintain the electronic parts, which are sensitive to heat, under high temperature conditions. In addition, metals have high mechanical strength and can be readily processed using sheet metal, die and cutting processes. Thus, metals are suitable materials for use as heat sinks, the shape of which can be complex.

However, it can be difficult to make heat sinks made of metal light weight because of the high density of metal. Moreover, processing costs can be high with metals.

Therefore, thermally conductive materials using synthetic resins have been developed to replace metals. For example, a thermally conductive resin could be used to make heat dissipation sheets or heat dissipation grease on printers, copiers, notebook computers, and the like.

Recently, it has been found that increased heat is generated by electronic devices because of their highly integrated nature and high performance. Moreover, as devices become thinner or lighter weight, the problem of dissipating generated heat is pronounced. At times, serious problems can arise in electronic devices due to locally generated heat, which can ultimately cause malfunction or burning of the devices. However, thermally conductive resins developed so far have low thermal conductivity, and accordingly there remains a need to solve the afore-mentioned problems using resins.

When thermally conductive insulating fillers are used in a large quantity in order to increase the thermal conductivity of the resin composition, the viscosity increases which in turn impairs the fluidity. As a result, articles cannot be produced by the injection molding process. In addition, the strength of the final product is not satisfactory. Therefore, it is important to form an efficient network of fillers inside the resin to maximize the thermal conductivity, while minimizing the amount of fillers. Sometimes a resin with a far lower viscosity is used in order to avoid impairing the fluidity during an injection molding process, even if the filler is added in a large quantity. However, resins with lower viscosity have low molecular weight which increases the reactivity between the molecular chains. This in turn can lead to hardening during the extrusion or injection molding process.

As a result, it is important to ensure the fluidity to form an efficient network of fillers so as to produce a resin composition having a high thermal conductivity and which makes injection molding possible. Further, the viscosity of the resin should be reduced and the stability during the process should be maintained.

In order to improve the thermal conductivity, carbon or graphite fillers have been used. However, although these fillers have a high thermal conductivity by themselves, they cannot be used in technological fields such as luminaries or electronic devices where electrical insulation property is required, because these fillers also have electrical conductivity.

SUMMARY OF THE INVENTION

Therefore, the inventors of the present invention have developed a polyphenylene sulfide resin composition that can have excellent thermal conductivity, improved surface appearance such as gloss, and excellent physical properties such as good electrical insulation property and fluidity. In addition, the present invention provides molded articles formed from the resin composition according to the present invention.

A polyphenylene sulfide resin composition in accordance with the present invention comprises (A) about 30 to about 50% by weight of polyphenylene sulfide resin; (B) about 1 to about 5% by weight of amorphous polyamide resin; and (C) about 45 to about 69% by weight of thermally conductive insulating fillers.

The weight average molecular weight of the polyphenylene sulfide resin can be in a range of about 3,000 to about 50,000 g/mol.

The glass transition temperature (Tg) of the amorphous polyamide resin (B) can be in a range of about 110 to about 200° C.

The amorphous polyamide resin can include a repeating unit as shown in Chemical Formula 1 below:

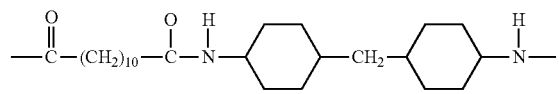

<Chemical Formula 1>

In accordance with the present invention, spherical thermally conductive insulating fillers (c1), plate-shaped thermally conductive insulating fillers (c2), or a combination thereof can be used as the thermally conductive insulating fillers (C).

Examples of the spherical thermally conductive insulating fillers (c1) can include magnesium oxide (MgO), alumina ($Al_2O_3$), aluminum nitride (AlN) and combinations thereof.

Examples of the plate-shaped thermally conductive insulating fillers (c2) can include boron nitride (BN), alumina ($Al_2O_3$) and combinations thereof.

The present invention can provide a polyphenylene sulfide resin composition that can have not only excellent thermal conductivity but also improved appearance such as gloss. The polyphenylene sulfide resin composition can also have excellent physical properties such as electrical insulation property and fluidity.

DETAILED DESCRIPTION OF THE INVENTION

The present invention will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The present invention relates to a polyphenylene sulfide resin composition. In particular, it relates to a polyphenylene sulfide resin composition that can have excellent thermal conductivity, improved surface appearance such as gloss, and excellent physical properties such as electrical insulation property and fluidity.

The polyphenylene sulfide resin composition in accordance with the present invention comprises: (A) a polyphenylene sulfide resin, (B) an amorphous polyamide resin, and (C) thermally conductive insulating fillers. Hereafter, each component of the present invention is explained in detail.

(A) Polyphenylene Sulfide Resin

Polyphenylene sulfide resin is a thermoplastic resin. The polyphenylene sulfide resin can maintain its properties at room temperature and also can have similar properties even at lower temperatures, for example at a temperature of about −50° C. Polyphenylene sulfide resin also can have excellent dimensional stability and creep resistance over a wide range of temperatures. In addition, polyphenylene sulfide resin can be non-toxic and safe, flame retardant, and have a relatively low viscosity.

The polyphenylene sulfide resin used in the present invention can be a linear polyphenylene sulfide resin including a repeating unit having the following formula (Chemical Formula 2) in an amount of more than about 70 mole %, based on the total moles of the resin.

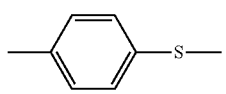

<Chemical Formula 2>

Crystallinity is a characteristic feature of a crystalline polymer. The polyphenylene sulfide resin can be highly thermally resistant, chemical resistant and strong when the polyphenylene sulfide resin includes the repeating unit of Chemical Formula 2 in an amount of more than about 70 mole %. A representative method of making a linear polyphenylene sulfide resin having this repeating unit is disclosed in Japanese Patent Bulletin No. 1977-12240, the entire disclosure of which is incorporated herein by reference.

The polyphenylene sulfide resin can further include up to 50 mole % of a repeating unit with a different structure than Chemical Formula 2. In exemplary embodiments, the polyphenylene sulfide resin can further include up to 30 mole % of the repeating unit of another structure. Examples of the other repeating units include without limitation the structures of Chemical Formula 3 to Chemical Formula 10 below:

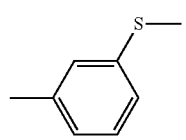

<Chemical Formula 3>

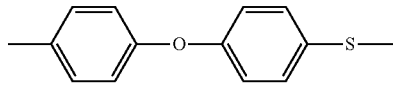

<Chemical Formula 4>

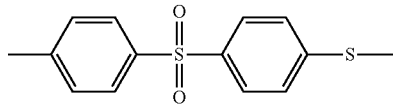

<Chemical Formula 5>

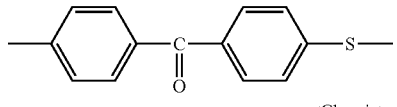

<Chemistry Formula 6>

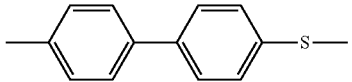

<Chemistry Formula 7>

<Chemistry Formula 8>

In the aforesaid Chemical Formula 8, R is C1-C20 alkyl, nitro, phenyl, C1-C20 alkoxy, carboxyl, or carboxylic acid salt.

<Chemical Formula 9>

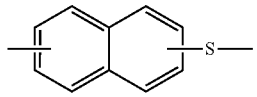

<Chemical Formula 10>

In exemplary embodiments, a polyphenylene sulfide resin prepared using more than about 50 mole % of p-dichlorobenzene and sodium sulfide can be used.

The polyphenylene sulfide resin can have low viscosity, which can allow increased filling with thermally conductive inorganic fillers.

In exemplary embodiments, the polyphenylene sulfide resin can have a weight average molecular weight of about 3,000 to about 50,000 g/mol, for example about 5,000 to about 30,000 g/mol, to provide low viscosity. When the polyphenylene sulfide resin has a weight average molecular weight within the above range, the thermal stability can also be excellent, which can minimize or eliminate problems of hardening caused by reaction between the resins during extrusion or injection molding processes.

The polyphenylene sulfide resin composition of the invention can include the polyphenylene sulfide resin in an amount of about 30 to about 50% by weight, based on the total weight (about 100% by weight) of the polyphenylene sulfide resin composition. In some embodiments, the polyphenylene sulfide resin composition can include the polyphenylene sulfide resin in an amount of about 30, 31, 32, 33, 34, 35, 36, 37, 38, 39, 40, 41, 42, 43, 44, 45, 46, 47, 48, 49, or 50% by weight. Further, according to some embodiments of the present invention, the amount of the polyphenylene sulfide resin can be in a range from about any of the foregoing amounts to about any other of the foregoing amounts. This can help provide flame retardance.

(B) Amorphous Polyamide Resin

An amorphous polyamide resin used in the present invention can be prepared from the following monomers:

branched and/or linear aliphatic diamines having 6 to 10 carbon atoms (also referred to herein as branched and/or linear aliphatic C6 to C10 diamines), such as but not limited to, 1,6-hexamethylene diamine, 2-methyl-1,5-diaminopentane, 2,2,4-trimethyl hexamethylene diamine, 2,4,4-trimethyl hexamethylene diamine, 1,9-nonamethylene diamine, 1,10-decamethylene diamine, 1,12-dodecamethylene diamine, and the like, and combinations thereof;

cycloaliphatic diamines having 6 to 22 carbon atoms (also referred to herein as C6 to C22 cycloaliphatic diamines), such as but not limited to, 4,4'-diamino dicyclohexylmethane, 3,3'-dimethyl-4,4'-diamino dicyclohexyl methane, 4,4'-diamino dicyclohexyl-2,2-propane, 1-4-diaminocyclohexane, 1,4-bis (amino methyl)cyclohexane, bis(aminomethyl)norbornane, 3-aminomethyl-3,5,5-trimethyl cyclohexyl amine, and the like, and combinations thereof;

aromatic aliphatic diamines having 8 to 22 carbon atoms (also referred to herein as C8 to C22 aromatic aliphatic diamines), such as but not limited to, m-xylenediamine, p-xylenediamine, 2,2-bis(4-aminophenyl)propane, and the like, and combinations thereof;

branched and/or linear aliphatic dicarboxylic acids having 6 to 22 carbon atoms (also referred to herein as C6 to C22 branched and/or linear aliphatic dicarboxylic acids), such as but not limited to, adipic acid, 2,2,4-trimethyl adipic acid, 2,4,4-trimethyl adipic acid, azelaic acid, sebacic acid, 1,12-dodecanedioic acid, and the like, and combinations thereof;

cycloaliphatic dicarboxylic acids having 6 to 22 carbon atoms (also referred to herein as C6 to C22 cycloaliphatic dicarboxylic acids), such as but not limited to, cyclohexane-1,4-dicarboxylic acid, 4,4'-dicarboxy cyclohexyl propane, 1,4-bis(carboxy methyl)cyclohexane, and the like, and combinations thereof;

aromatic aliphatic dicarboxylic acids having 8 to 22 carbon atoms (also referred to herein as C8 to C22 aromatic aliphatic dicarboxylic acids), such as but not limited to, diphenylmethane-4,4'-dicarboxylic acid, and the like, and combinations thereof;

aromatic dicarboxylic acids having 8 to 22 carbon atoms (also referred to herein as C8 to C22 aromatic dicarboxylic acids), such as but not limited to, isophthalic acid, tert-butyl isophthalic acid, terephthalic acid, 1,4-naphthalenedicarboxylic acid, 1,5-naphthalenedicarboxylic acid, 2,6-naphthalenedicarboxylic acid, 2,7-naphthalenedicarboxylic acid, diphenic acid, diphenyl ether-4,4'-dicarboxylic acid, and the like, and combinations thereof; and lactam or laurolactam having 6 to 12 carbon atoms, w-amino dicarboxylic acid, 8-caprolactam, ∈-aminocaproic acid, ω-aminododecanoic acid having 6 to 12 carbon atoms and the like, and combinations thereof.

Examples of amorphous polyamide resins in accordance with the present invention include without limitation: polyamides prepared from terephthalic acid and 2,2,4-trimethyl hexamethylene diamine or 2,4,4-trimethyl hexamethylene diamine, polyamides prepared from isophthalic acid and 1,6-hexamethylene diamine, copolyamides prepared from a combination of terephthalic acid/isophthalic acid and 1,6-hexamethylene diamine, copolyamides prepared from isophthalic acid, 3,3'-dimethyl-4,4'-diamino dicyclohexyl methane, and laurolactam, or lactam, and copolyamides prepared from a combination of terephthalic acid/isophthalic acid, 3,3'-dimethyl-4,4'-diamino dicyclohexyl methane and laurolactam.

An exemplary amorphous polyamide resin useful in the invention is commercially available under the trade name CX7373, from Evonik, Germany and is prepared from 1,12-dodecanedioic acid and 4,4'-diamino dicyclohexylmethane. The repeating unit of the polyamide resin is given below in Chemical Formula 1.

<Chemical Formula 1>

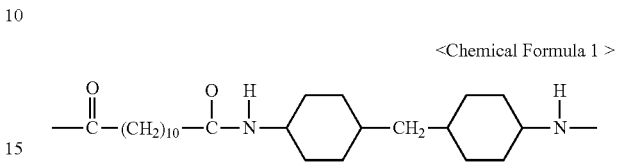

The amorphous polyamide resin can have a glass transition temperature of about 110 to about 200° C., for example about 120 to about 170° C., measured by DSC (differential scanning calorimetry).

The polyphenylene sulfide resin composition of the invention can include the amorphous polyamide resin (B) in an amount of about 1 to about 5% by weight, based on the total weight (about 100% by weight) of the polyphenylene sulfide resin composition. In some embodiments, the polyphenylene sulfide resin composition can include the amorphous polyamide resin in an amount of about 1, 2, 3, 4 or 5% by weight. Further, according to some embodiments of the present invention, the amount of the amorphous polyamide resin can be in a range from about any of the foregoing amounts to about any other of the foregoing amounts.

If the polyphenylene sulfide resin composition includes the amorphous polyamide resin in an amount less than about 1% by weight, the appearance and fluidity of the resin composition may be impaired. If the polyphenylene sulfide resin composition includes the amorphous polyamide resin in an amount greater than about 5% by weight, the composition may not have sufficient flame retardance.

(C) Thermally Conductive Insulating Fillers

Currently, metal powders and carbon fillers such as carbon fiber, carbon nanotubes, carbon nanofibers, and graphite are used as thermally conductive fillers in the preparation of thermally conductive resin compositions.

However, the carbon fillers and metal powders not only have high thermal conductivity but also have high electrical conductivity. Accordingly, the thermally conductive resin compositions made using the same also have electrical conductivity. Therefore, such compositions are not suitable for preparing a resin composition having excellent thermal conductivity and electrical insulation property.

Ceramic fillers can be thermally conductive insulating fillers with non-electrical conductivity. Ceramic fillers, however, have low thermal conductivity, and accordingly must be used in an amount of filler high enough in order to prepare an electrical insulating resin composition with high thermal conductivity. However, if the amount of filler is increased in the resin composition, the viscosity of the resin composition becomes higher which impairs the processability of extrusion or injection molding. Thus it can be difficult to manufacture products including these ceramic fillers and the mechanical strength of the final product can be reduced.

Therefore, in order to prepare a resin composition having thermal conductivity and electrical insulation property as well as excellent mechanical property, the amount of the thermally conductive insulating filler used should be as small as possible. In addition, an effective thermally conductive network should be formed between the thermally conductive insulating fillers.

Heat is known to be transmitted by one kind of acoustic particles called as 'phonon'. The phonon has the property of sound waves, and thus it is transmitted well in a crystalline medium. In a thermally conductive insulating resin composition, the phonon is transmitted easily and rapidly inside the thermally conductive insulating fillers which are constituted with a crystalline lattice. However, the transmission of phonons is very difficult in the medium of polymers having low crystallinity and thermal conductivity. Moreover, because of the characteristics of a sound wave, the phonons are scattered, and a significant amount of phonons can be lost at the interface between the thermally conductive insulating fillers and the polymer resin. Thus, heat is almost not transmitted in the polymer resin which has a low thermal conductivity. Rather, heat is transmitted by the thermally conductive insulating fillers which have a high thermal conductivity.

Therefore, if the volume occupied by the thermally conductive insulating fillers is increased in the unit volume of the thermally conductive insulating resin composition in order to remove the voids between the fillers, as much as possible and if the contact area and the possibility of contact between the fillers is increased, the thermal conductivity of the resin composition could be effectively increased.

Meanwhile, the probability of contacting the thermally conductive insulating fillers and their contact areas is dependent on the type of the fillers. Spherical fillers make point contact, thus the contact area is small. In contrast, plate-shaped fillers make a face contact between them (contact one another face-to-face), so that the probability of contact and the contact area becomes greater.

However, plate-shaped fillers have large surface areas as compared to spherical fillers. Adding plate-shaped fillers according can increase the viscosity of the thermally conductive insulating resin composition, which can lower the fluidity of the resin composition. In contrast, spherical fillers can be used in as large of an amount as possible, without increasing the viscosity of the resin composition.

A thermally conductive resin composition in accordance with the present invention was devised to exhibit high thermal conductivity by forming an effective thermally conductive network considering all these factors. At the same time, this resin composition can exhibit excellent fluidity, mechanical strength, and physical properties.

A thermally conductive resin composition in accordance with the present invention can include spherical thermally conductive insulating fillers (c1), plate-shaped thermally conductive insulating fillers (c2), or a combination thereof.

The resin composition can include spherical thermally conductive insulating fillers (c1) in a relatively higher amount without increasing the viscosity of the resin composition. Plate-shaped thermally conductive insulating fillers (c2) can increase the probability of contact and contact area. Therefore, these may form a more effective thermally conductive network by supplementing the drawbacks of each other. By doing so, the resin composition comprising these fillers can have a high thermal conductivity.

Examples of spherical thermally conductive insulating fillers (c1) include without limitation magnesium oxide (MgO), alumina ($Al_2O_3$) aluminum nitride (AlN) and the like, and combinations thereof.

Examples of the plate-shaped thermally conductive insulating fillers (c2) include without limitation boron nitride (BN), alumina ($Al_2O_3$) and the like, and combinations thereof. For example, boron nitride (BN), having a high thermal conductivity among the ceramic fillers, can be used.

Magnesium oxide can be used to improve the thermal conductivity in the vertical direction (z-axis) against (transverse to) the injection molding direction in accordance with the present invention. Magnesium oxide can be a spherical particle which can provide good heat dissipation and fluidity properties. Spherical magnesium oxide thus can provide excellent thermal conductivity not only in the horizontal direction (in the XY plane) but also in the vertical direction (the z-axis) transverse to the injection molding direction. Furthermore, spherical magnesium oxide also can have excellent electrical insulation property. Thus, the thermal conductivity of the thermally conductive resin composition can be significantly increased regardless of the direction.

In exemplary embodiments, spherical magnesium oxide having an average particle size of about 30 to about 80 µm, for example about 40 to about 60 µm, can be used, taking into account fluidity and the balance with other physical properties.

The polyphenylene sulfide resin composition can include the thermally conductive insulating filler (C) in an amount of about 45 to about 69% by weight, based on the total weight (about 100% by weight) of the polyphenylene sulfide resin composition. In some embodiments, the polyphenylene sulfide resin composition can include the thermally conductive insulating filler in an amount of about 45, 46, 47, 48, 49, 50, 51, 52, 53, 54, 55, 56, 57, 58, 59, 60, 61, 62, 63, 64, 65, 66, 67, 68, or 69% by weight. Further, according to some embodiments of the present invention, the amount of the thermally conductive insulating filler can be in a range from about any of the foregoing amounts to about any other of the foregoing amounts.

If the polyphenylene sulfide resin composition includes thermally conductive insulating filler in an amount less than about 45% by weight, the thermal conductivity may not be sufficient. If the polyphenylene sulfide resin composition includes the thermally conductive insulating filler in an amount greater than about 69% by weight, the fluidity can be significantly impaired, and the impact strength of the formed product can be reduced.

(D) Other Additives

The resin composition in accordance with the present invention can optionally include one or more additives. Examples of the additives include without limitation antioxidants, lubricants, flame retardants, thermal stabilizers, inorganic additives, pigments, dyes, and the like, and combinations thereof. The additives can be used in an amount selected to improve the physical properties of the resin composition with minimal or no decrease in thermal conductivity. In exemplary embodiments, the resin composition can include the additives in an amount of about 1 to about 7 parts by weight, based on about 100 parts by weight of the thermally conductive resin composition.

A thermally conductive resin composition in accordance with the present invention can be prepared according to conventional methods known in the art for preparing a resin composition. For example, the constituent components, and optionally additive(s), can be mixed and extruded to prepare the resin composition in pellet form. The pellets can be processed also using conventional methods such as but not limited to injection molded or extrusion molded, blow molded, compression molded or extrusion molded to prepare a molded product.

The thermally conductive resin composition can be used in the manufacture of a variety of products. For example, it can be used in the manufacture of main bodies of electrical or electronic products such as TVs, computers, mobile phones, office automation devices and chassis, heat sinks, and LED heat radiation pins which require excellent thermal conductivity.

Hereinafter, exemplary compositions of the invention will be explained in greater detail with reference to the following examples. However, these examples are given for the purpose of illustration and not to be constructed as limiting the scope of the invention.

EXAMPLES

The specification of each component used in the following example and comparative example are as below.

(A) Polyphenylene Sulfide Resin (PPS)

A polyphenylene sulfide resin with a weight average molecular weight in the range of 30,000 to 35,000 g/mol obtained from Deokyang (China) is used.

(B) Amorphous Polyamide Resin

An amorphous polyamide resin, CX7373, obtained from Evonik (Germany) is used.

(B') Crystalline Polyamide Resin

A crystalline polyamide resin, TP4407, obtained from Zigsheng (China) is used.

(C) Thermally Conductive Insulating Fillers (c1) Spherical magnesium oxide with an average particle size of 50 μm is used.

(c2) Plate-shaped boron nitride with an average crystal size of 10 to 15 μm obtained from Momentive (USA) is used.

(c3) Spherical alumina with an average particle size of 50 μm obtained from Denka (Japan) is used.

Example 1

39% by weight of polyphenylene sulfide resin (A), 1% by weight of amorphous polyamide resin (B), and 60% by weight of magnesium oxide (c1) as thermally conductive insulating filler (C) are mixed to prepare the polyphenylene sulfide resin composition. This polyphenylene sulfide resin composition is processed by a twin screw extruder with a screw size L/D=36, Φ=45 mm to prepare pellets. The prepared pellets are dried at 90° C. for more than three hours and specimens in accordance with ASTM specifications are prepared by injection molding the pellets at a temperature of 300° C. to determine physical properties, such as thermal conductivity, surface gloss and fluidity.

Examples 2 to 5 and Comparative Examples 1 to 7

Specimens are prepared in accordance with the same method of Example 1 except using the compositions set forth in Table 1 below. The test results are also indicated in Table 1 below.

Methods for Determining Physical Properties (1) Thermal conductivity (W/mK): Measured in accordance with ASTM E1461 in the horizontal direction (in the XY plane) transverse to the injection molding direction.

(2) Fluidity (mm): An injection molding process is carried out in a spiral shaped mold, the cross-sectional area of which is 1 mm×10 mm, at an injection molding temperature of 340° C., at a mold temperature of 130° C., and an injection molding pressure of 80%. The degree of resin filling into the mold is measured as a function of length (mm) by the method of measurement, and the relative fluidity is determined for the examples and comparative examples.

(3) Surface gloss (%): Surface gloss was measured at 60° by the method specified in the specification ASTM D536.

(4) Appearance (rating): The appearance of the samples are evaluated by the naked eye in accordance with the following ratings: very good: 5-4, good: 3, normal: 2, bad: 1, very bad: 0.

TABLE 1

|  |  | Example |  |  |  |  | Comparative Example |  |  |  |  |  |  |
| --- | --- | --- | --- | --- | --- | --- | --- | --- | --- | --- | --- | --- | --- |
|  |  | 1 | 2 | 3 | 4 | 5 | 1 | 2 | 3 | 4 | 5 | 6 | 7 |
| (A) |  | 39 | 37 | 35 | 37 | 37 | 40 | 40 | 40 | 39 | 37 | 35 | 35 |
| (B) |  | 1 | 3 | 5 | 3 | 3 | — | — | — | — | — | — | 7 |
| (B') |  | — | — | — | — | — | — | — | — | 1 | 3 | 5 | — |
| (C) | (c1) | 60 | 60 | 60 | — | — | 60 | — | — | 60 | 60 | 60 | 60 |
|  | (c2) | — | — | — | 60 | — | — | 60 | — | — | — | — | — |
|  | (c3) | — | — | — | — | 60 | — | — | 60 | — | — | — | — |
| Thermal conductivity (W/mK) |  | 2.07 | 2.02 | 1.97 | 3.87 | 1.51 | 2.10 | 3.98 | 1.58 | 2.08 | 2.04 | 2.00 | 1.81 |
| Appearance (rating) |  | 4 | 5 | 5 | 5 | 5 | 2 | 0 | 1 | 2 | 2 | 2 | 5 |
| Surface gloss (%) |  | 75 | 78 | 82 | 56 | 68 | 62 | 50 | 60 | 68 | 69 | 71 | 79 |
| Fluidity (mm) |  | 51 | 56 | 62 | 30 | 47 | 44 | 25 | 35 | 46 | 49 | 56 | 67 |

(Unit: % by weight)

The results of the evaluation of the physical properties set forth in Table 1 above indicate that Examples 1 to 3 including amorphous polyamide resin (B) and spherical magnesium oxide (c1) as thermally conductive insulating fillers exhibit excellent fluidity and surface gloss without impairing the thermal conductivity as compared with Comparative Example 1 and Comparative Examples 4 to 6. Comparative Example 1 did not include an amorphous polyamide resin (B), and Comparative Examples 4 to 6 include crystalline polyamide resin (B').

In addition, the data in Table 1 indicates that the fluidity and surface gloss improved in Examples 4 to 5 as compared with Comparative Examples 2 to 3. Examples 4 to 5 include an amorphous polyamide resin (B), while Comparative Examples 2 to 3 did not include an amorphous polyamide resin (B).

Further, the thermal conductivity decreased when the amorphous polyamide resin is included in an amount greater than about 5% by weight as in Comparative Example 7. Further, when the crystalline polyamide resin is used, satisfactory fluidity and surface gloss are not obtained.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A polyphenylene sulfide resin composition comprising:
   (A) about 30 to about 50 wt % of a polyphenylene sulfide resin;
   (B) about 1 to about 5 wt % of an amorphous polyamide resin; and
   (C) about 45 to about 69 wt % of thermally conductive insulating fillers including spherical thermally conductive insulating fillers (c1), wherein the spherical thermally conductive insulating fillers (c1) include magnesium oxide (MgO), alumina ($Al_2O_3$), aluminum nitride (AlN) or a combination thereof, and wherein the thermally conductive insulating fillers optionally include plate-shaped thermally conductive insulating fillers (c2).

2. The polyphenylene sulfide resin composition of claim 1, wherein the polyphenylene sulfide resin (A) has a weight average molecular weight of about 3,000 to about 50,000 g/mol.

3. The polyphenylene sulfide resin composition of claim 1, wherein the amorphous polyamide resin (B) has a glass transition temperature (Tg) about 110 to about 200° C.

4. The polyphenylene sulfide resin composition of claim 1, wherein the amorphous polyamide resin (B) includes a repeating unit of Chemical Formula 1 below:

<Chemical Formula 1>

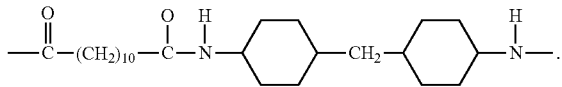

5. The polyphenylene sulfide resin composition of claim 1, wherein the amorphous polyamide resin (B) includes polyamide prepared from terephthalic acid and 2,2,4-trimethyl hexamethylene diamine or 2,4,4-trimethyl hexamethylene diamine; polyamide prepared from isophthalic acid and 1,6-hexamethylene diamine; a copolyamide prepared from a combination of terephthalic acid/isophthalic acid and 1,6-hexamethylene diamine; a copolyamide prepared from isophthalic acid, 3,3'-dimethyl-4,4'-diamino dicyclohexylmethane, and laurolactam or lactam; copolyamide prepared from a combination of terephthalic acid/isophthalic acid, 3,3'-dimethyl-4,4'-diamino dicyclo hexylmethane and laurolactam, or a combination thereof.

6. The polyphenylene sulfide resin composition of claim 1, wherein the plate-shaped thermally conductive insulating filler (c2) comprises boron nitride (BN), alumina ($Al_2O_3$) or a combination thereof.

7. The polyphenylene sulfide resin composition of claim 1, wherein the spherical thermally conductive insulating filler (e1) comprises magnesium oxide (MgO) having an average particle size of about 30 to about 80 μm.

8. The polyphenylene sulfide resin composition of claim 1, further including one or more additives selected from the group consisting of antioxidants, lubricants, flame retardants, thermal stabilizers, inorganic additives, pigments, dyes, and combinations thereof in an amount of about 1 to about 7 parts by weight, based on about 100 parts by weight of the resin composition.

9. A molded product prepared from the polyphenylene sulfide resin composition of claim 1.

10. The formed product of claim 9, which is a light emitting diode (LED) heat radiation pin.

UNITED STATES PATENT AND TRADEMARK OFFICE
CERTIFICATE OF CORRECTION

PATENT NO. : 8,765,858 B2  Page 1 of 1
APPLICATION NO. : 13/723363
DATED : July 1, 2014
INVENTOR(S) : Chan Gyun Shin et al.

It is certified that error appears in the above-identified patent and that said Letters Patent is hereby corrected as shown below:

In the Specification

Column 4, Line 12 should read: "<Chemical Formula 6>"

Column 4, Line 17 should read: "<Chemical Formula 7>"

Column 4, Line 22 should read: "<Chemical Formula 8>"

Column 5, Line 55 should read: "Ω-amino dicarboxylic acid, 8-caprolactam, €-aminocaproic"

In the Claims

Claim 7, Column 12, Line 20 should read: "(c1) comprises magnesium oxide (MgO) having an average"

Signed and Sealed this
Third Day of March, 2015

Michelle K. Lee
*Deputy Director of the United States Patent and Trademark Office*